United States Patent
Kono (10) Patent No.: US 9,425,307 B2
(45) Date of Patent: Aug. 23, 2016

(54) SEMICONDUCTOR DEVICE AND MANUFACTURING METHOD THEREOF

(71) Applicant: KABUSHIKI KAISHA TOSHIBA, Tokyo (JP)

(72) Inventor: Hiroshi Kono, Himeji Hyogo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/636,636

(22) Filed: Mar. 3, 2015

(65) Prior Publication Data
US 2016/0079413 A1    Mar. 17, 2016

(30) Foreign Application Priority Data
Sep. 12, 2014 (JP) ................ 2014-186141

(51) Int. Cl.
| H01L 29/76 | (2006.01) |
| H01L 29/78 | (2006.01) |
| H01L 29/94 | (2006.01) |
| H01L 29/423 | (2006.01) |
| H01L 29/36 | (2006.01) |
| H01L 29/66 | (2006.01) |
| H01L 29/16 | (2006.01) |

(52) U.S. Cl.
CPC ........ *H01L 29/7813* (2013.01); *H01L 29/1608* (2013.01); *H01L 29/36* (2013.01); *H01L 29/4236* (2013.01); *H01L 29/42376* (2013.01); *H01L 29/66068* (2013.01); *H01L 29/66734* (2013.01)

(58) Field of Classification Search
CPC ....... H01L 29/7813; H01L 29/66068; H01L 29/66734; H01L 29/4236; H01L 29/36; H01L 29/42376; H01L 29/1608
USPC ........... 257/328, 239, 330, 331, 332, 341, 257/E29.021, E29.066, E29.121, E29.257, 257/E23.033, E23.069, E21.218, E21.252, 257/E21.345, E27.06; 438/270, 272, 239
See application file for complete search history.

(56) References Cited

U.S. PATENT DOCUMENTS

| 6,351,018 B1* | 2/2002 | Sapp ............... H01L 27/0629 257/155 |
| 7,573,096 B2* | 8/2009 | Takemori ......... H01L 29/66734 257/330 |
| 7,825,449 B2 | 11/2010 | Suzuki et al. |

(Continued)

FOREIGN PATENT DOCUMENTS

| JP | 2009-194065 A | 8/2009 |
| JP | 2012-169385 A | 9/2012 |
| WO | 2012-108165 A1 | 8/2012 |

*Primary Examiner* — Dao H Nguyen
(74) *Attorney, Agent, or Firm* — Patterson & Sheridan, LLP (57) ABSTRACT

A semiconductor device includes a first electrode, a second electrode, a first semiconductor region of a first conductivity type between the first electrode and the second electrode, a plurality of second semiconductor regions of a second conductivity type selectively provided between the first semiconductor region and the second electrode, a third semiconductor region of the first conductivity type provided between each of the second semiconductor regions and the second electrode, an insulating film provided on the first semiconductor region in a location between adjacent second semiconductor regions, the second semiconductor regions, and the third semiconductor region; and a third electrode located over the insulating film, wherein a portion of the insulating film and the third electrode extend inwardly of the second semiconductor regions.

11 Claims, 9 Drawing Sheets

(56) References Cited

U.S. PATENT DOCUMENTS

| | | | |
|---|---|---|---|
| 7,964,913 B2* | 6/2011 | Darwish | H01L 29/0649 257/329 |
| 8,193,564 B2 | 6/2012 | Suzuki et al. | |
| 2004/0173844 A1* | 9/2004 | Williams | H01L 29/4236 257/329 |
| 2008/0265320 A1* | 10/2008 | Mauder | H01L 29/0653 257/341 |
| 2010/0317158 A1* | 12/2010 | Yilmaz | B82Y 10/00 438/138 |
| 2012/0305993 A1* | 12/2012 | Willmeroth | H01L 27/088 257/262 |
| 2013/0230956 A1* | 9/2013 | Meiser | H01L 29/66477 438/270 |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2014-186141, filed Sep. 12, 2014, the entire contents of which are incorporated herein by reference.

FIELD

Embodiments described herein relate to a semiconductor device and a manufacturing method thereof.

BACKGROUND

In semiconductor devices such as Metal Oxide Semiconductor Field Effect Transistor (MOSFET), useful in a power semiconductor device, the device structure is configured to increase channel density in order to carry, or pass, a large amount of current. A trench gate structure is one example. As the underlying semiconductor material of the semiconductor device, silicon carbide (SiC) and silicon (Si) are used.

The electric field intensity of silicon carbide at breakdown is about ten times as large as that of silicon. When using silicon carbide as the material of a semiconductor device, an electric field strength that is about ten times the amount which can be applied to a silicon-based semiconductor device can be applied before the silicon carbide based semiconductor device will fail.

In that case, however, a larger electric field is applied to a trench gate compared with the silicon based semiconductor device having the same structure, thereby causing a breakdown of a gate insulating film or a gate electrode of the trench gate.

DETAILED DESCRIPTION

Embodiments provide a semiconductor device and a manufacturing method thereof improved in a breakdown voltage of a trench gate.

In general, according to one embodiment, a semiconductor device includes: a first electrode, a second electrode, a first semiconductor region of a first conductivity type provided between the first electrode and the second electrode, a plurality of second semiconductor regions of a second conductivity type selectively between the first semiconductor region and the second electrode, a third semiconductor region of the first conductivity type provided between the second semiconductor regions and the second electrode, an insulating film provided on the first semiconductor region in a location between adjacent second semiconductor regions, the second semiconductor regions, and the third semiconductor region; and a third electrode located over the insulating film, wherein a portion of the insulating film and the third electrode extend inwardly of the second semiconductor regions. The corners of the third electrode are inset into end portions of the second semiconductor region, such that a portion of the second semiconductor region extends between the inset portion of the third electrode and the first semiconductor region.

The embodiments will be hereinafter described with reference to the drawings. In the following description, the same reference codes are attached to the same members and the description as for a member having been described is properly omitted. In the drawings concerned to the embodiments, XYZ coordinates are adopted.

(First Embodiment)

Figure 1A:
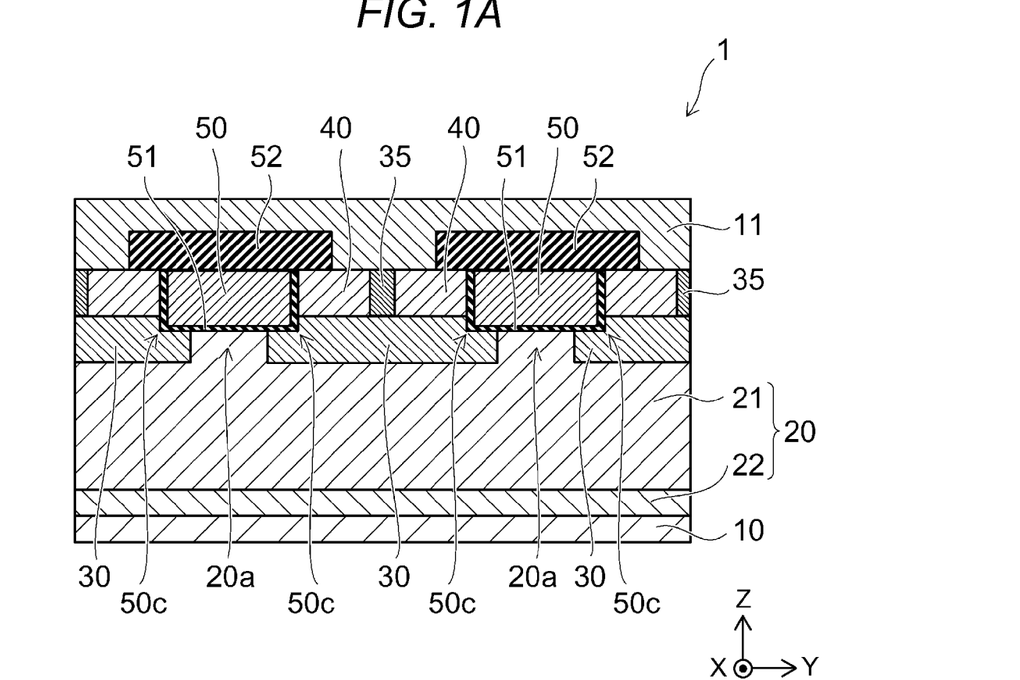
FIG. 1A is a schematic sectional view illustrating a portion of a semiconductor device according to a first embodiment taken along the line A-A' of FIG. 1B.
Figure 1B:
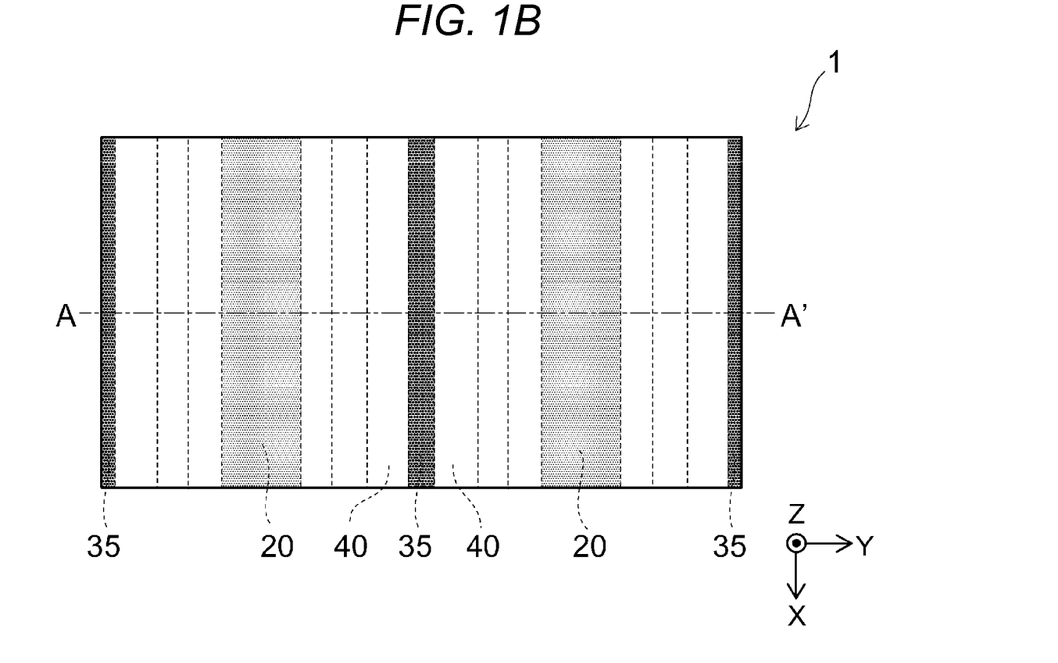
FIG. 1B is a schematic plan view illustrating the semiconductor device according to the first embodiment.

FIG. 1A is a schematic sectional view illustrating a portion of a semiconductor device according to the first embodiment, wherein the section is cut along the line A-A' of FIG. 1B, and FIG. 1B is a schematic plan view illustrating the semiconductor device according to the first embodiment.

A semiconductor device 1 according to the first embodiment is MOSFET having an upper and lower electrode structure. For example, the semiconductor device 1 includes a first electrode 10 (hereinafter, for example, a drain electrode 10) as a lower electrode and a second electrode 11 (hereinafter, for example, a source electrode 11) as an upper electrode.

In the semiconductor device 1, an n type or an $n^+$ type first semiconductor region 20 (for example, a semiconductor region 20) is provided as a layer between the drain electrode 10 and the source electrode 11. The semiconductor region 20 includes an n type drift region 21 and an $n^+$ type drain region 22. The drain region 22 is provided between the drift region 21 and the drain electrode 10. The drain region 22 is in contact with the drain electrode 10.

A plurality of p type second semiconductor regions 30 (hereinafter, for example, base regions 30) are selectively provided as a layer between the semiconductor region 20 and the source electrode 11. The plural base regions 30 respectively extend in the X direction. Individual ones of the plural base regions 30 are disposed in the Y direction at a predetermined interval therebetween. The plural base regions 30 are in contact with the semiconductor region 20.

An $n^+$ type third semiconductor region 40 (hereinafter, for example, a source region 40) is provided as a layer between each of the plural base regions 30 and the source electrode 11.

The source region 40 is in contact with the base region 30. A p+ type semiconductor region 35 is provided between each of the plural base regions 30 and the source electrode 11. The source electrode 11 is in contact with the source regions 40 and the semiconductor regions 35. A silicide layer (not shown) may be provided between the source electrode 11 and the source regions 40 and the semiconductor regions 35.

A third electrode 50 (hereinafter, for example, a gate electrode 50) is provided between the source electrode 11 and a portion 20a of the semiconductor region 20 interposed between base regions 30 adjacent to each other in the Y direction. The gate electrode 50 is provided on the semiconductor region 20 in a location interposed between adjacent base regions 30. An insulating film (hereinafter, for example, a gate insulating film 51) is located between the gate electrode 50 and the semiconductor region 20, the base regions 30, and the source regions 40. Corner portions of the gate electrode 50 on the drain electrode 10 side thereof extend inwardly of, and are separated from contact with the base regions by, the gate insulating film 51. For example, the gate electrode 50 is provided between the source electrode 11 and the portion 20a of the semiconductor region 20 interposed between the adjacent base regions 30, and additionally provided between the source electrode 11 and each part of the adjacent base regions 30 interposing the portion 20a of the semiconductor region 20. The gate electrode 50 extends in the X direction of FIG. 1A perpendicular to the Z direction and between the drain electrode 10 to the source electrode 11.

The gate insulating film. 51 is provided between the gate electrode 50 and the semiconductor region 20, the base regions 30, and the source regions 40. An interlayer insulating film 52 is provided between the gate electrode 50 and the source electrode 11.

FIG. 1A illustrates a rectangular cross section of the gate electrode 50, by example, as a cross section of the gate electrodes 50 when it is cut off perpendicular to the X direction. The respective corner portions 50c of the gate electrode 50 on the side of the drain electrode 10 are spaced from contact with the respective base regions 30 by the gate insulating film 51. In other words, the corner portions 50c of the gate electrode 50 are inset into, but electrically isolated from, the base regions 30.

The main component of the semiconductor regions is, for example, silicon carbide (SiC). The main component of the semiconductor regions may alternatively be silicon (Si) or gallium nitride (GaN). The material of the insulating film and the interlayer insulating film includes, for example, silicon oxide (SiOx) or silicon nitride (SiNx).

The material of the electrodes 10 and 11 is a metal including at least one selected from a group of, for example, aluminum (Al), titanium (Ti), nickel (Ni), tungsten (W), and gold (Au). The material of the gate electrode 50 includes, for example, polysilicon.

Unless otherwise specified, the dopant concentration of the n type dopant (second conductivity type) is indicated in decreasing order from the n+ type (highest) to the n type. The dopant concentration of the p type (first conductivity type) is indicated in decreasing order from the type (highest) to the p type.

As a dopant element of the conductivity type of the n+ type and the n type, for example, phosphorus (P) or arsenic (As) is used. As a dopant element of the conductivity type of the p+ type and the p type, for example, boron (B) or aluminum (Al) is used. Further, even when the conductivity type of the p type and the n type may be reversed in the semiconductor device 1, the same effect may be obtained.

Figure 2A:
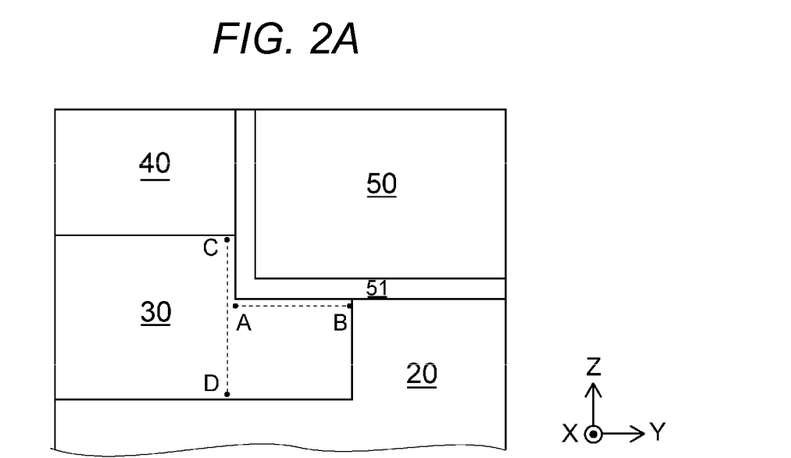
FIG. 2A is a schematic enlarged sectional view in a vicinity of a base region in the semiconductor device according to the first embodiment.
Figure 2B:
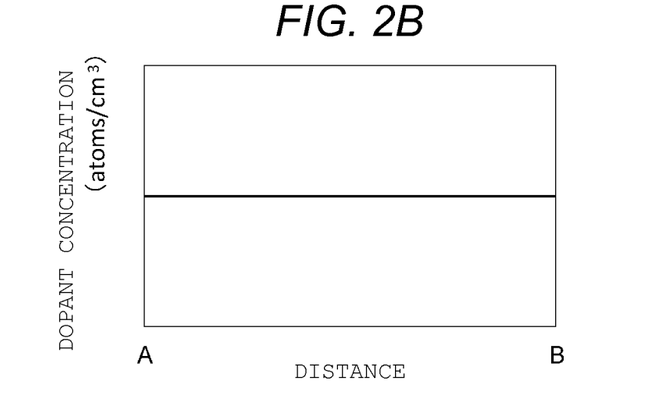
FIGS. 2B and 2C are graphs illustrating a dopant concentration profile in the base region of the semiconductor device according to the first embodiment.
Figure 2C:
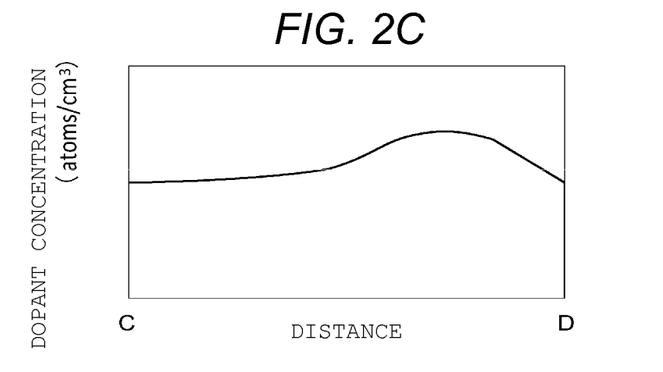

FIG. 2A is a schematic enlarged sectional view of a portion of the base region 20 in the semiconductor device according to the first embodiment, and FIGS. 2B and 2C are graphs illustrating dopant concentration profiles in the base region 20 of the semiconductor device according to the first embodiment.

Here, FIGS. 2B and 2C illustrate one example of the dopant concentration profile in a channel region formed in the base region 30. For example, FIG. 2B illustrates one example of the dopant concentration profile between the point A and the point B in FIG. 2A, and FIG. 2C illustrates one example of the dopant concentration profile between the point C and the point D in FIG. 2A.

As illustrated in FIG. 2B, the dopant concentration between point A and point B of FIG. 2A is substantially constant. On the other hand, as illustrated in FIG. 2C, the dopant concentration between point C and point R peaks nearer to point D than point C.

The base region 30 is formed by activating the p type dopant element according by a thermal process after implanting ions of the p type dopant element in the vicinity of the top surface of the semiconductor region 20. When aluminum (Al) is used as a dopant element, the dopant element hardly diffuses as a result of the thermal processing (heating). Therefore, multiple steps of ion implantation are performed so that the dopant concentration profile resultant from the ion implantation may be the state as shown in FIGS. 2B and 2C. On the other hand, when boron (B) is used as the dopant element, the thermal diffusion of the dopant element as a result of the thermal processing has to be considered. Considering the dopant diffusion from the peak position between the point C and the point D, multiple steps of ion implantation are performed, hence to make the dopant concentration at a substantially constant in the Y direction (between point A-point B) and make the peak of the dopant concentration profile at a predetermined position in the Z direction (between point C-point D).

The dopant concentration between point C and point D illustrated in FIG. 2C may be adjusted to be substantially constant. This dopant concentration profile is also included in the embodiment.

Functionality of the semiconductor device 1 will be described.

Figure 3A:
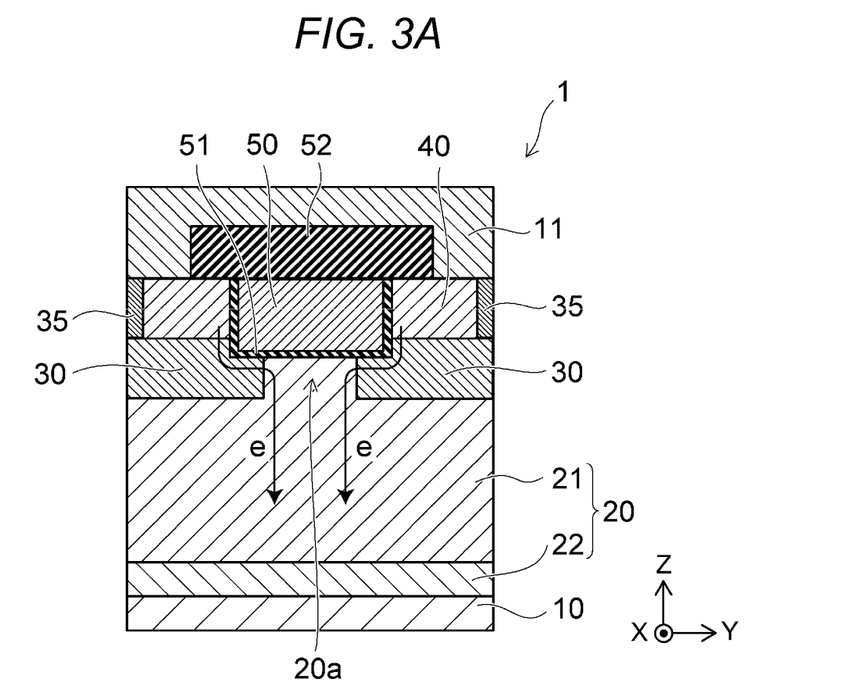
FIGS. 3A and 3B are schematic sectional views illustrating functionality of the semiconductor device according to the first embodiment.
Figure 3B:
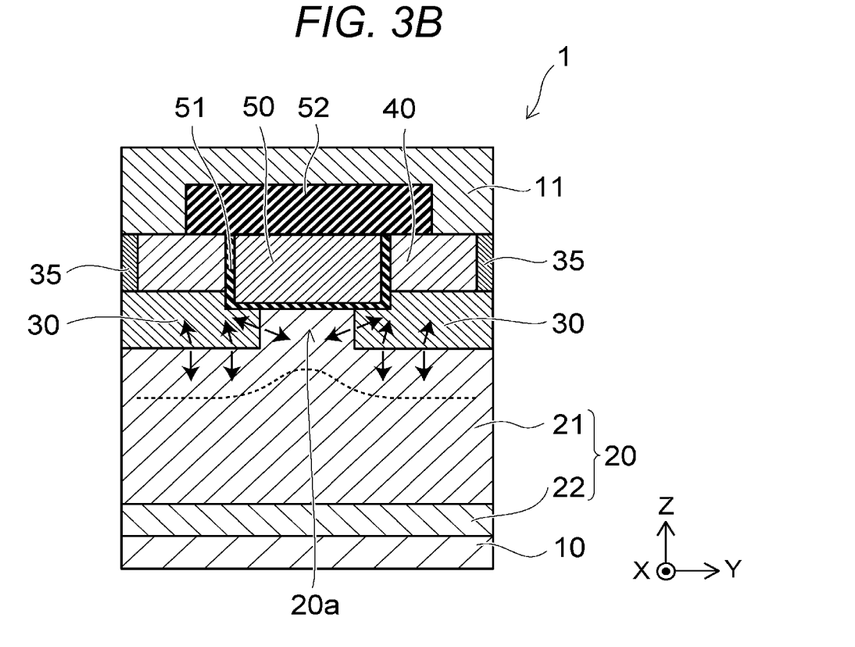

FIGS. 3A and 3B are a schematic sectional views illustrating the functionality of the semiconductor device according to the first embodiment.

FIG. 3A illustrates the ON state of the semiconductor device 1.

In the semiconductor device 1, a higher potential than the potential on the source electrode 11 is applied to the drain electrode 10. When a threshold potential (Vth) or greater is applied to the gate electrode 50, a channel region is formed along the gate insulating film 51 in the base regions 30. Therefore, electrons (e) flow, for example, to the source region 40, the channel region, and the drift region 21 from the source electrode.

The dopant concentration of the channel region is established at a lower value than the dopant concentration in a vicinity of the pn joint portion (FIG. 2C). In other words, when a predetermined potential is applied to the gate electrode 50, the dopant concentration of the channel region is such that an inversion layer will form therein.

FIG. 3B illustrates the OFF state of the semiconductor device 1.

In the OFF state, a higher potential than the potential on the source electrode 11 may be applied to the drain electrode 10. If a potential lower than the threshold potential is applied to the gate electrode 50, a channel is not formed in the base region 30 and the semiconductor device 1 is in the OFF state.

In the OFF state, a depletion layer expands from the pn junction portion of the base region 30 and the drift region 21 into both the base region 30 and the drift region 21 (arrows in FIG. 3B). Depletion layers expanding from the pn junction portions on the both sides overlap with each other, in the portion 20a of the semiconductor region 20 interposed by the adjacent base regions 30.

In other words, a depletion layer is formed faster in the drift region 21 under the gate electrode 50 than in the base region 30, and the drift region 21 under the gate electrode 50 is blocked by the depletion layer. According to this, in the OFF state, it is hard for an electric field to enter into the base region 30 and the electric field applied to the gate insulating film 51 is relaxed. Further, at the application of a high voltage, the electric field concentrates on the corner portions of the base regions 30, hence suppressing the intensity of the electric field applied to the gate insulating film 51 at the bottom of the trench gate. This effect of suppressing the electric field is determined by the intervals of the base regions 30, the peak concentration of the dopant concentration of the base region 30, and the dopant concentration of the drift region 21 between the base regions 30. By properly setting these parameters, breakdown of the gate insulating film 51 is suppressed, and the reliability of the semiconductor device is improved.

Further, in the semiconductor device 1, as illustrated in FIG. 2C, a peak of the dopant concentration profile between the point C and the point D is located on the side of the base region 30 nearer to the pn junction portion rather than with the main body of the base region 30. The concentration of dopants at the surface of the base region 30 in contact with the gate insulating film 51 is adjusted so that the channel region may be an inversion channel at a proper threshold voltage, as mentioned above. On the other hand, by setting the peak concentration of the base region 30 higher than that of the drift region 21 by two orders of magnitude, the depletion layer expanding from the pn junction portion spreads in the drift region 21 under the gate electrode 50 and the drift region 21 under the base region 30 faster than within of the base region 30. Accordingly, in the OFF state, it is hard for the depletion layer to reach the source region 40 and so-called punch-through is suppressed.

In the semiconductor device 1, the corner portions 50c of the gate electrode 50 are inset into the base regions 30. According to this, in the OFF state, an electric field concentration on the corner portions 50c (FIG. 1A) of the gate electrode 50 is suppressed. Therefore, the gate insulating film 51 is protected and is unlikely to fail, due to the suppression of the electric field concentration thereon.

A manufacturing process of the semiconductor device 1 according to the first embodiment will be described.

FIGS. 4A to 7B are a schematic sectional views illustrating a manufacturing process in an important portion of the semiconductor device according to the first embodiment.

Figure 4A:
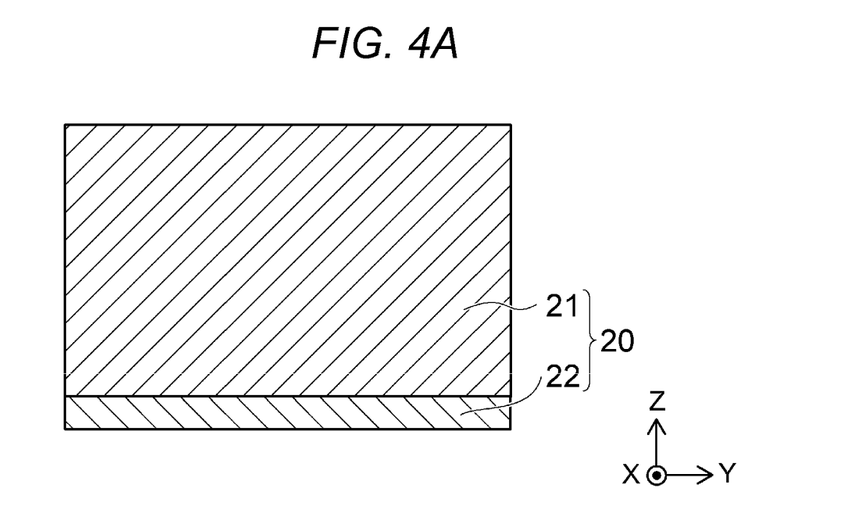
FIGS. 4A and 4B are schematic sectional views illustrating a status of the semiconductor device of the first embodiment during the manufacturing process thereof.

For example, as illustrated in FIG. 4A, a semiconductor region 20 having the drain region 22 and the drift region 21 provided on the drain region 22 is prepared.

Figure 4B:
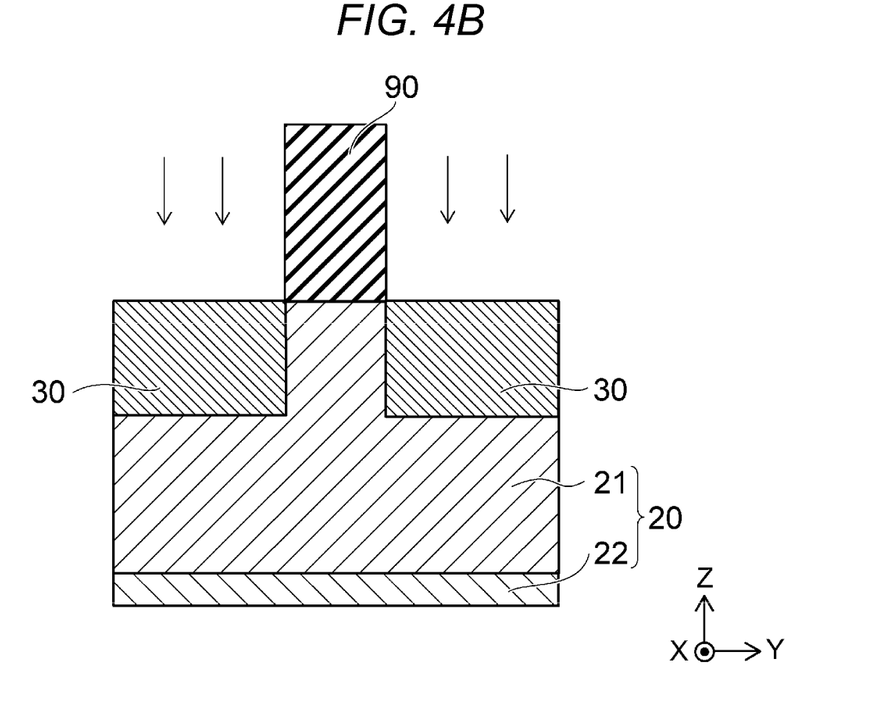

As illustrated in FIG. 4B, a mask layer 90 is selectively formed on the semiconductor region 20. The mask layer 90 includes silicon oxide. The p type dopant element is implanted on the surface of the semiconductor region 20 exposed from the mask layer 90.

For example, the arrows of the figure schematically indicate the implantation of the dopant element (hereinafter, the same). According to this, the plural base regions 30 are selectively formed on the surface of the semiconductor region 20.

The plural base regions 30 are adjacent to each other in the Y direction. Then, the mask layer 90 is removed.

Figure 5A:
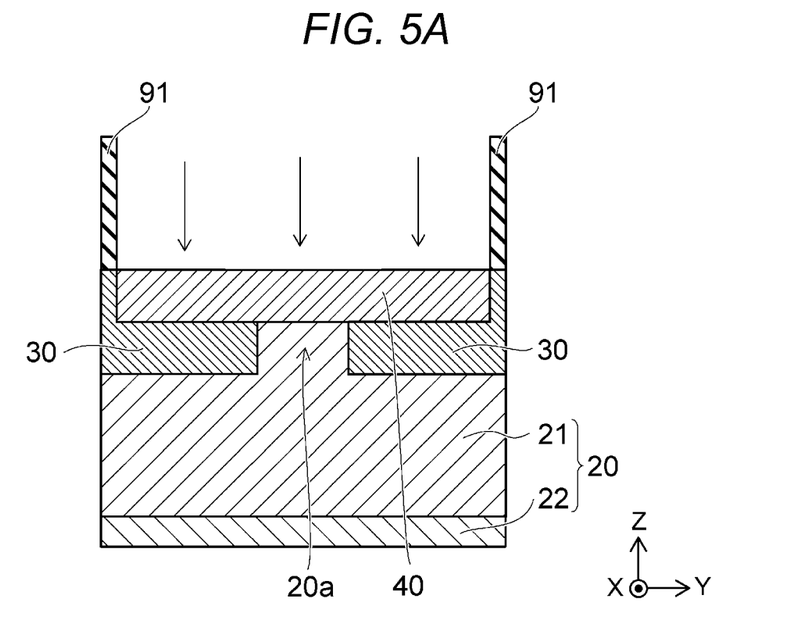
FIGS. 5A and 5B are schematic sectional views illustrating the status of the semiconductor device of the first embodiment during the manufacturing process thereof.

Then, as illustrated in FIG. 5A, a mask layer 91 is selectively formed on the base region 30. The mask layer 91 includes silicon oxide. Continuously, the n type dopant element is implanted on the surface of the semiconductor region 20 and the surface of the base regions 30 exposed from the mask layer 91. Then, the mask layer 91 is removed.

According to this, the source region 40 is formed on the surface of the portion 20a of the semiconductor region 20 and the surface of the plural base regions 30. The portion 20a of the semiconductor region 20 is a portion interposed by the adjacent base regions 30.

Figure 5B:
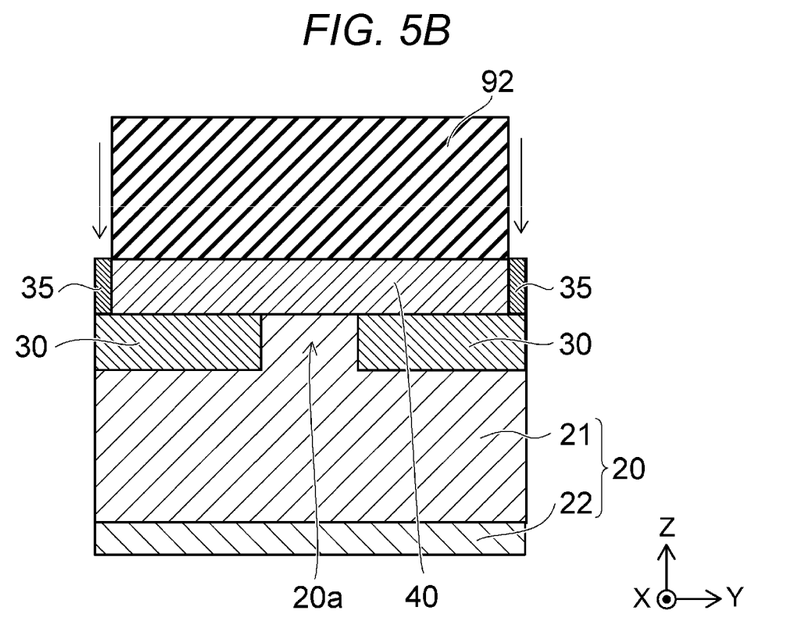

As illustrated in FIG. 5B, a mask layer 92 is selectively formed on the source region 40. The mask layer 92 includes silicon oxide. Subsequently, the p type dopant element is implanted on the surface of the source region 40 exposed by the mask layer 92. According to this, a semiconductor region 35 in contact with the source region 40 is formed. Then, the mask layer 92 is removed. After removing the mask layer 92, the structure is heated, for example, at a temperature of 1,600° C. to 2,000° C., to activate the respective dopant elements.

Figure 6A:
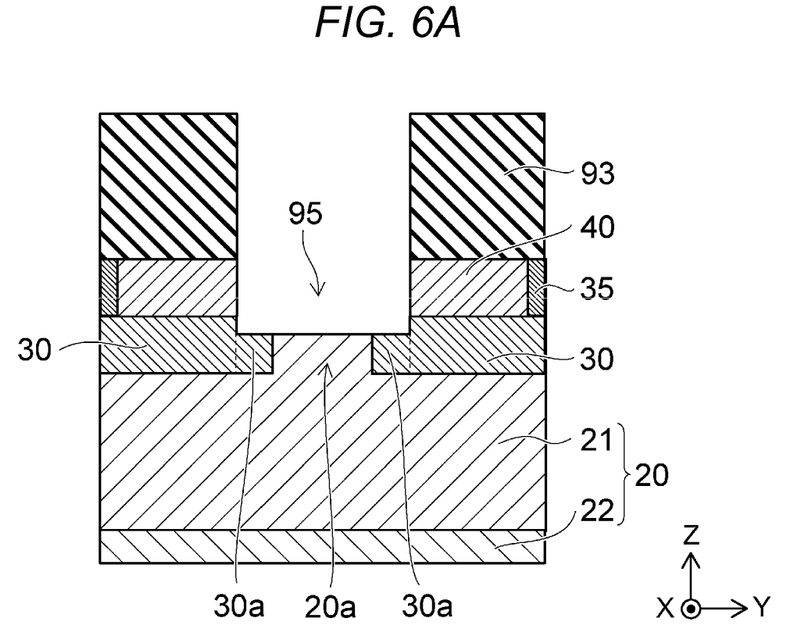
FIGS. 6A and 6B are schematic sectional views illustrating the status of the semiconductor device of the first embodiment during the manufacturing process thereof.

As illustrated in FIG. 6A, a mask layer 93 is selectively formed on the source region 40 and the semiconductor region 35. The mask layer 93 includes silicon oxide, resist and the like. Subsequently, a part of the source region 40 exposed from the mask layer 93, and a part of the semiconductor region 20 and a part of the base region 30 positioned under the above part are removed. The respective regions are removed according to the Reactive Ion Etching (RIE).

According to this, a trench 95 is formed, and the portion 20a of the semiconductor region 20 and each part 30a of the base regions in contact with the portion 20a of the semiconductor region 20 are exposed. Then, the mask layer 93 is removed.

Figure 6B:
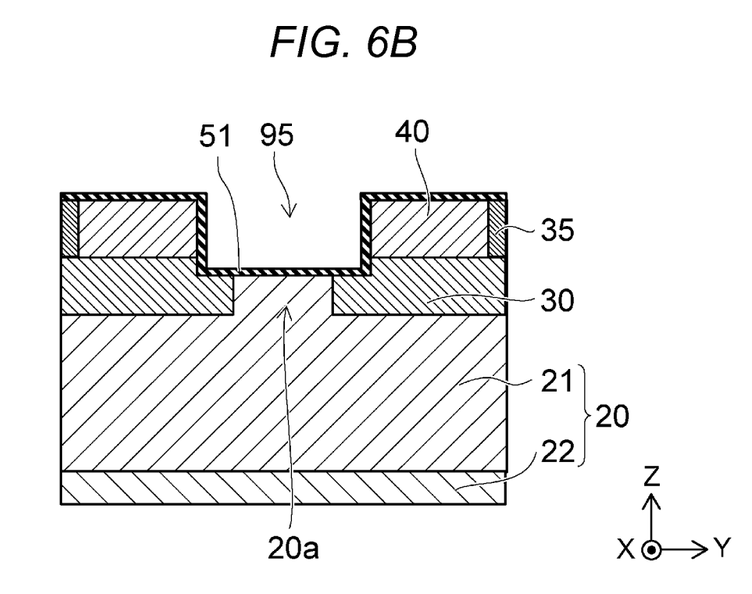

As illustrated in FIG. 6B, the gate insulating film 51 is formed within the trench 95, on the source regions 40 and on the semiconductor regions 35. The gate insulating film 51 may be formed by thermal oxidation or nitriding of the underlying semiconductor material. Gas for use in the nitriding is, for example, NO, $N_2O$, and $NH_3$. Alternatively, the gate insulating film 51 may be formed by Chemical Vapor Deposition (CVD).

Figure 7A:
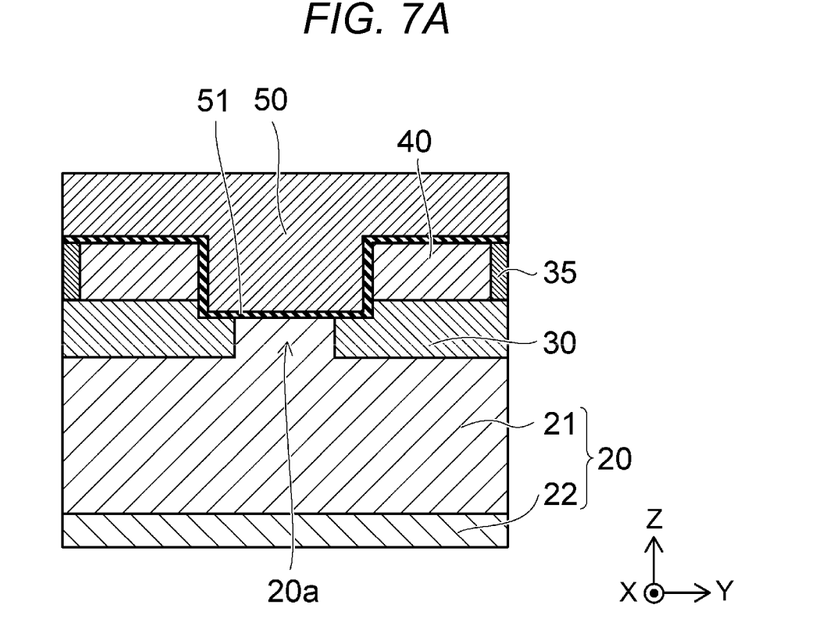
FIGS. 7A and 7B are schematic sectional views illustrating the status of the semiconductor device of the first embodiment during the manufacturing process thereof.

As illustrated in FIG. 7A, the gate electrode 50 is formed within the trench 95, on the source regions 40, and on the semiconductor regions 35 through the gate insulating film 51. The gate electrode 50 is formed, for example, according to the CVD. Then, the gate electrode 50 on the source regions 40 and on the semiconductor regions 35 is removed together with the gate insulating film 51 in those locations using Chemical Mechanical Polishing (CMP) or etch-back.

Figure 7B:
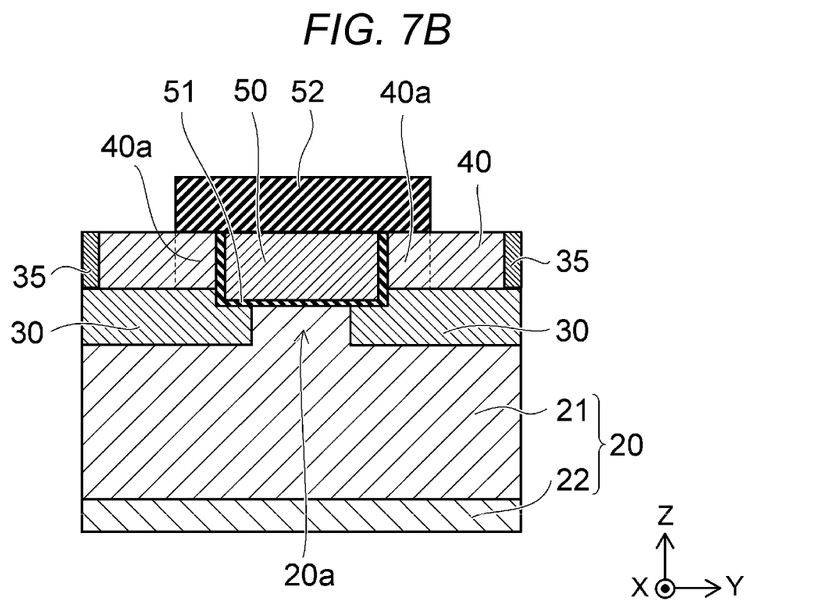

As illustrated in FIG. 7B, the interlayer insulating film 52 is formed on the gate electrode 50, on the gate insulating film 51, and on parts 40a of the source regions 40. Then, the drain electrode 10 connected to the drain region 22 and the source electrode 11 connected to the source region 40 and the semiconductor region 35 are formed to yield the structure shown in FIG. 1A. 1A. According to these manufacturing processes, the semiconductor device 1 is formed.

Figure 8:
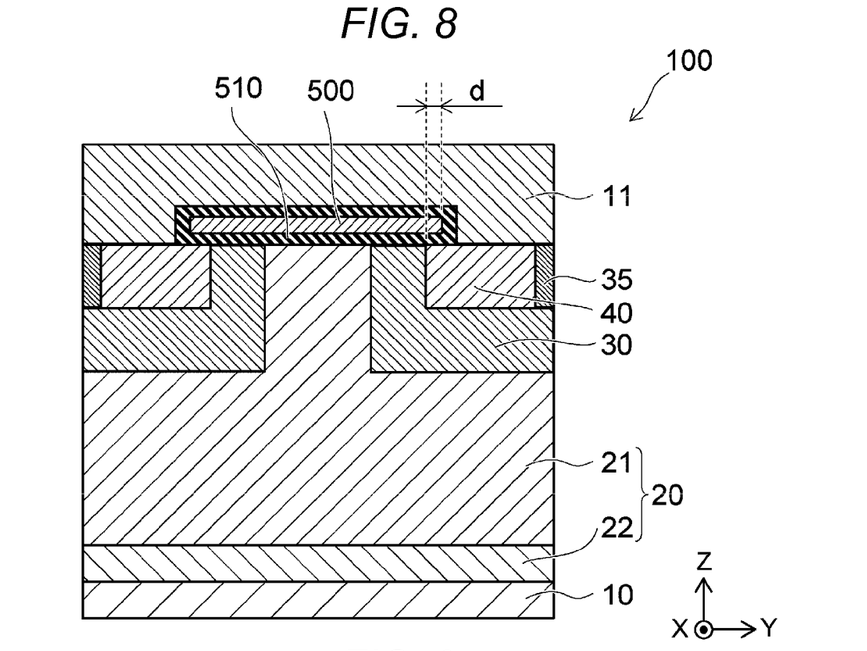
FIG. 8 is a schematic sectional view illustrating a portion of a semiconductor device according to a reference example.

FIG. 8 is a schematic sectional view illustrating a semiconductor device according to a reference example.

A semiconductor device 100 according to the reference example is a Double Diffused Metal Oxide Semiconductor Field Effect Transistor (DMOSFET) having a planar gate structure. The semiconductor device 100 includes a planar-type gate electrode 500 on the semiconductor region 20, the base regions 30, and the source regions 40. A gate insulating film 510 is provided between the gate electrode 500 and the semiconductor region 20, base regions 30, and source regions 40.

The MOSFET needs to provide a gate electrode on a drift region, base regions, and source regions spaced therefrom by a gate insulating film. Therefore, the semiconductor device 100 also requires an overlapped region d where the gate electrode 500 is formed over the source region 40 is formed.

The diffusion coefficient of the dopant element in silicon (Si) is higher than that of the dopant element in silicon carbide (SiC). When the semiconductor region 20 is made of silicon (Si), the overlapped region d may be obtained easily by dopant implantation and heating with the gate electrode 500 used as a mask. This is because when the semiconductor region 20 is made of silicon (Si), the dopant element easily diffuses under the gate electrode 500 under thermal diffusion conditions.

However, when the semiconductor region 20 is made of silicon carbide (SiC), the dopant element does not diffuse as easily as in the case of silicon (Si). Therefore, it is difficult to diffuse the dopant element under the gate electrode 500 using dopant implantation and heating. In other words, when the semiconductor region 20 is of silicon carbide (SiC), the overlapped region d is not fully obtained using dopant implantation and heating.

Accordingly, when the semiconductor region 20 is made of silicon carbide (SiC), after forming the source regions 40, it is necessary to form the gate electrode 500 using a Photo Engraving Process (PEP) so that the overlapped region d is produced.

As miniaturization of the semiconductor device proceeds, the processing of overlapping the region where the gate electrode 500 is formed with the region where the source region is formed gets more difficult. In other words, as miniaturization of the semiconductor device proceeds, it is more difficult to obtain the overlapped region d.

On the contrary, in the first embodiment, the mask layer 93 is selectively formed on the source region 40 and the semiconductor regions 35. Subsequently, a part of the source region 40 exposed by the mask layer 93, and a part of the semiconductor region 20 and parts of the base regions 30 positioned under the above part are removed, hence forming the trench 95 (FIG. 6A). Subsequently, the gate electrode 50 is formed within the trench 95 over the gate insulating film 51 (FIG. 7A).

In short, according to the first embodiment, the positioning work is not necessary to put the gate electrode 50 on the source region 40. According to the first embodiment, the gate electrode 50 is assuredly provided on the drift region 21, the base regions 30, and the source regions 40 over the intervening gate insulating film 51 in a self-aligned way. According to the first embodiment, even as further miniaturization proceeds, the overlapped region of the gate electrode 50 and the source region 40 may be assuredly obtained.

(Second Embodiment)

Figure 9:
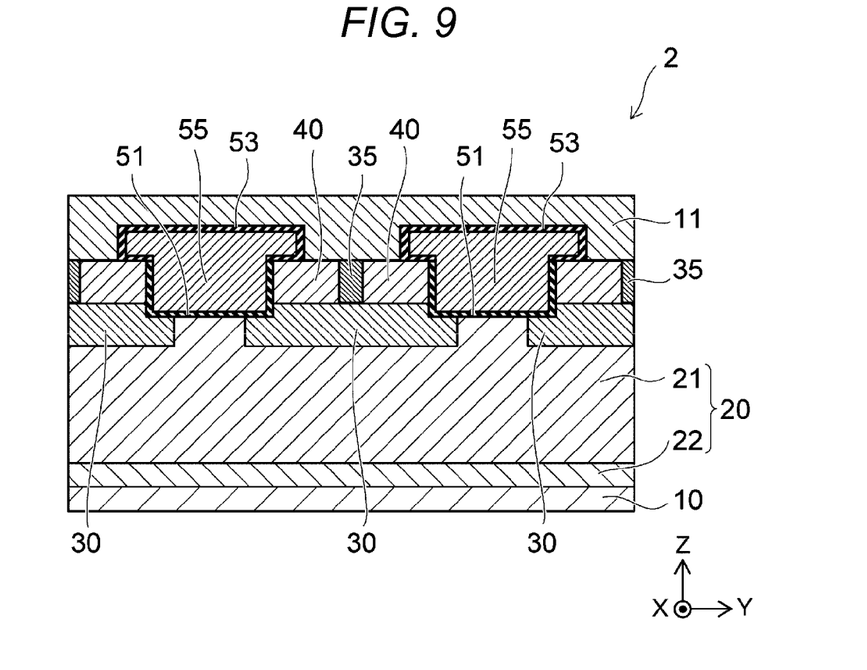
FIG. 9 is a schematic sectional view illustrating a portion of a semiconductor device according to a second embodiment.

FIG. 9 is a schematic sectional view illustrating a semiconductor device according to the second embodiment.

In a semiconductor device 2 according to the second embodiment, a portion of the gate electrode 55 extends over the source regions 40. An insulating film 53 is provided between the gate electrode 55 and the source electrode 11. This structure is also included in the embodiment.

Figure 10A:
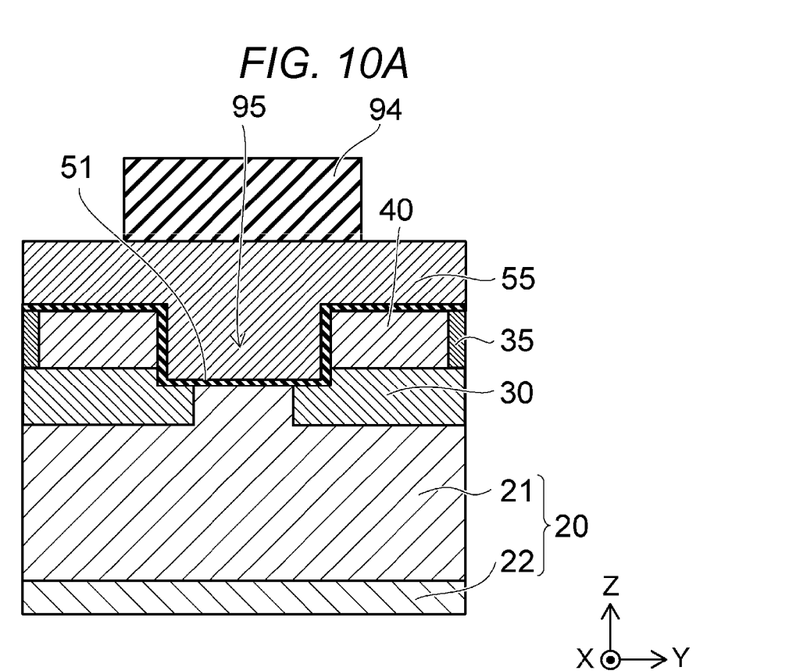
FIGS. 10A and 10B are schematic sectional views illustrating a status of the semiconductor device of the second embodiment during the manufacturing process thereof.
Figure 10B:
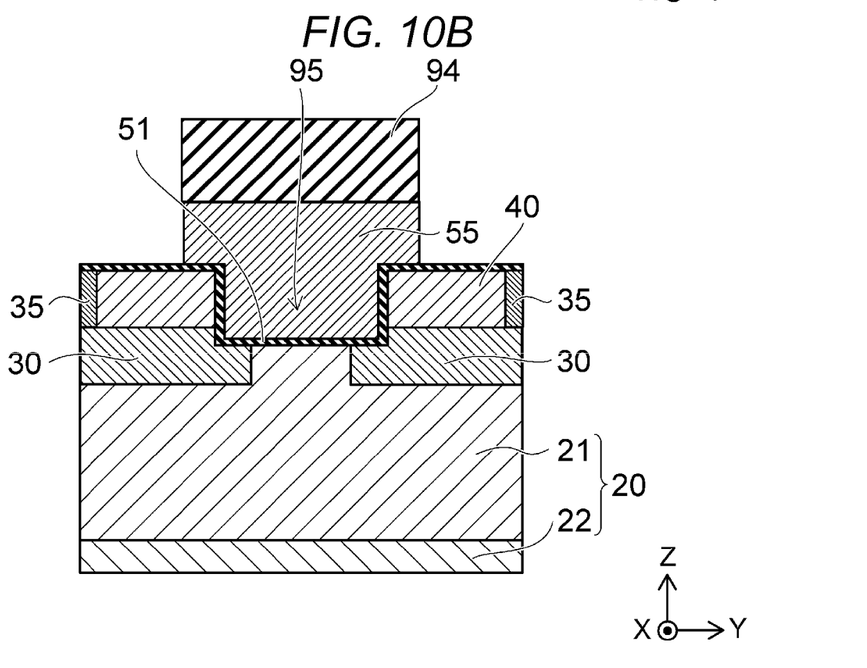

FIGS. 10A to 10B are schematic sectional views illustrating the manufacturing processes in an important portion of the semiconductor device according to the second embodiment.

For example, after forming the gate electrode 55 within the trench 95, on the source regions 40, and on the semiconductor regions 35 over the gate insulating film 51, a mask layer 94 is selectively formed on the gate electrode 55, as illustrated in FIG. 10A. The mask layer 94 is provided above parts of the source regions 40. The mask layer 94 includes silicon oxide, resist and the like.

Then, as illustrated in FIG. 10B, the gate electrode 55 exposed by the mask layer 94 is removed using RIE. According to this, such a structure may be obtained where the gate electrode 55 is provided not only within the trench 95 but also over the source regions 40.

Then, as illustrated in FIG. 9, the insulating film 53 is formed around the gate electrode 55 and then, the drain electrode 10 connected to the drain region 22 and the source electrode 11 connected to the source regions 40 and the semiconductor regions 35 are formed. By these manufacturing processes, the semiconductor device 2 is formed.

Also in the semiconductor device 2 according to the second embodiment, the lower structure from the source regions 40 and the lower structure below the gate electrode 55 are the same as those of the semiconductor device 1. Accordingly, the semiconductor device 2 has the same effect as the semiconductor device 1. Further, in the semiconductor device 2, the manufacturing process for forming the interlayer insulating film 52 is not necessary. Owing to this, aligning the interlayer insulating film 52 and the source region 40 does not require much accuracy. As the result, the manufacturing process is simplified and the manufacturing cost is reduced.

As mentioned above, the embodiments have been described with reference to the concrete examples. The embodiments are not restricted to these concrete examples. In other words, a proper change and modification added to these concrete examples by those skilled in the art is to be included in the scope of the embodiments as far as it has the characteristics of the embodiments. Each element included in the above mentioned concrete examples and disposition thereof, material, condition, shape, and size are not restricted to the described ones but may be properly changed.

Each element included in the respective embodiments may be combined as far as the combination is technically possible, and the combination is to be included in the scope of the embodiments as far as it has the characteristics of the embodiments. Within the scope and spirit of the embodiments, it is understood that those skilled in the art will easily arrive at various changes and modifications and that these changes and modifications will be included in the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a first electrode;
a second electrode;
a first semiconductor region of a first conductivity type between the first electrode and the second electrode;

a plurality of second semiconductor regions of a second conductivity type selectively provided between the first semiconductor region and the second electrode;

a third semiconductor region of the first conductivity type provided between the second semiconductor regions and the second electrode;

an insulating film provided on the first semiconductor region in a location between adjacent second semiconductor regions, the second semiconductor regions, and the third semiconductor region; and a third electrode located over the insulating film, wherein a portion of the insulating film and the third electrode extend inwardly of the second semiconductor regions, wherein the corners of the third electrode are inset into end portions of the second semiconductor region, such that a portion of the second semiconductor region extends between the inset portion of the third electrode and the first semiconductor region.

2. The device according to claim 1, wherein the third electrode extends in a first direction perpendicular to a second direction from the first electrode to the second electrode, and the plural second semiconductor regions are arranged along the second direction.

3. The device according to claim 2, wherein the third electrode is rectangular in cross section.

4. The device according to claim 1, wherein the third electrode extends over at least a portion of the third semiconductor region.

5. The device according to claim 1, further comprising a fourth semiconductor region of the second conductivity type extending through the third semiconductor region of the first conductivity type from the second semiconductor region of the second conductivity type to the second electrode.

6. The device according to claim 5, wherein the dopant concentration of the second conductivity type in the fourth semiconductor region is greater than the dopant concentration of the second conductivity type in the second semiconductor region.

7. The device according to claim 1, wherein a portion of the first semiconductor region extends inwardly of a space between adjacent second semiconductor regions and into contact with the insulating region in the location between adjacent second semiconductor regions.

8. The device according to claim 7, wherein the concentration of the second dopant type in the first semiconductor region is smaller in the portion of the first semiconductor region extending inwardly of a space between adjacent second semiconductor regions than in portions of the first semiconductor region disposed between the second semiconductor regions and the first electrode.

9. The device according to claim 1, wherein the first electrode is a drain electrode, the second electrode a source electrode, and the third electrode a gate electrode.

10. A semiconductor device, comprising:

a first semiconductor layer extending over a first electrode and doped as a first conductivity type;

a plurality of second semiconductor regions, doped as a second conductivity type, extending inwardly of the first semiconductor layer, such that a portion of the first semiconductor layer extends therebetween, and facets are provided adjacent the upper ends thereof furthest from the first electrode, and extending inwardly of the sides thereof;

a third semiconductor layer doped as the first conductivity type provided over the second semiconductor layer;

a first insulating layer covering adjacent surfaces of the facets, the first semiconductor layer and the third semiconductor layer; and a conductor disposed over the first insulating layer and extending inwardly of the facets.

11. The semiconductor device of claim 10, wherein the conductor is a gate electrode.

\* \* \* \* \*